United States Patent [19]
Eisenbeiser et al.

[11] Patent Number: 6,057,566
[45] Date of Patent: May 2, 2000

[54] SEMICONDUCTOR DEVICE

[75] Inventors: Kurt W. Eisenbeiser, Tempe; Yang Wang, Phoenix; Jenn-Hwa Huang, Gilbert; Vijay K. Nair, Mesa, all of Ariz.

[73] Assignee: Motorola, Inc., Schaumburg, Ill.

[21] Appl. No.: 09/069,338

[22] Filed: Apr. 29, 1998

[51] Int. Cl.[7] .............................................. H01L 31/0328
[52] U.S. Cl. ........................................... 257/194; 257/655
[58] Field of Search ............................. 257/194, 15, 655

[56] References Cited

U.S. PATENT DOCUMENTS

| | | | |
|---|---|---|---|
| 5,153,682 | 10/1992 | Goto et al. | 257/194 |
| 5,262,660 | 11/1993 | Streit et al. | 257/194 |
| 5,596,211 | 1/1997 | Onda et al. | 257/194 |
| 5,652,440 | 7/1997 | Chang | 257/194 |
| 5,739,558 | 4/1998 | Ishida et al. | 257/194 |
| 5,811,844 | 9/1998 | Kuo et al. | 257/194 |

OTHER PUBLICATIONS

Y. Chan et al., "High Uniformity of $Al_{0.3}Ga_{0.7}As/In_{0.15}Ga_{0.85}As$ Doped–Channel Structures Grown by Molecular Beam Epitaxy on 3" GaAs Substrates, Journal of Electronic Materials vol. 23, No. 7, Mar. 1994, pp. 675–679.

K. Eisenbeiser et al., "Theoretical Analysis of the Breakdown Voltage in Pseudomorphic HFET's" IEEE Transactions on Electron Devices, vol. 43, No. 11, Nov. 1996, pp. 1778–1787.

B. Kim et al., "Millimeter–Wave GaAs Power FET with a Pulse–Doped InGaAs Channel", IEEE Electron Device Letters, vol. 9, No. 5, May 1988, pp. 203–204.

B. Kim et al., "AlGaAs/InGaAs/GaAs Quantum–Well Power MISFET at Millimeter–Wave Frequencies", IEEE Electron Device Letters, vol. 9, No. 11, Nov. 1988, pp. 610–612.

P. Saunier et al., "AlGaAs/InGaAs Heterostructures with Doped Channels for Discrete Devices and Monolithic Amplifiers" IEEE Transactions on Electron Devices, vol. 36, No. 10, Oct. 1989, pp. 2231–2235.

Y. Chan et al., "Device Linearity Improvement by $Al_{0.3}Ga_{0.7}As/In_{0.2}Ga_{0.8}As$ Heterostructure Doped–Channel FET's", IEEE Electron Device Letters, vol. 16, No. 1, Jan. 1995, pp. 33–35.

J. Dickmann et al., "Double–Side Planar–Doped AlGaAs/InGaAs/AlGaAs MODFET with Current Density of 1 A/mm", IEEE Electron Device Letters, vol. 12, No. 6, Jun. 1991.

P. Saunier et al., "A Double–Heterojunction Doped–Channel Pseudomorphic Power HEMT with a Power Density of 0.85 W/mm at 55 GHz", IEEE Electron Device Letters, vol. 9, No. 8, Aug. 1988, pp. 397–398.

P. Saunier et al., "Doped–Channel Heterojunction Structures for Millimeter–Wave Discrete Devices and MMICs" IEEE Conference Proceedings, CH2681, May 1989, pp. 40.2.1–40.2.5, pp. 0730–0734.

*Primary Examiner*—Mark V. Prenty
*Attorney, Agent, or Firm*—William E. Koch

[57] ABSTRACT

A semiconductor device includes a buffer layer (23) having a doped region (24), a barrier layer (26) over the buffer layer (23) and having a doped region (27), and a channel layer (25) located between the buffer layer (23) and the barrier layer (26) where the doping density of the doped region (27) in the barrier layer (26) is higher than the doping densities of the channel layer (25) and the doped region (24) in the first buffer layer (23).

19 Claims, 1 Drawing Sheet

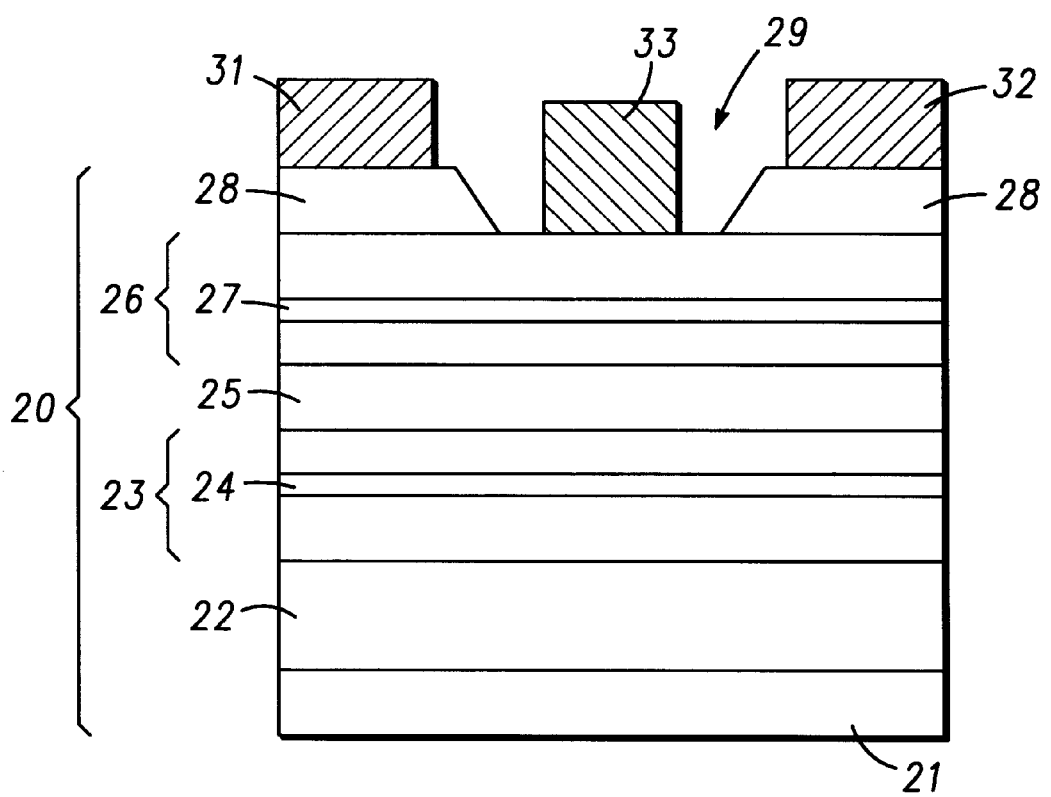

SEMICONDUCTOR DEVICE

BACKGROUND OF THE INVENTION

This invention relates, in general, to semiconductors, and more particularly, to semiconductor devices.

High electron mobility transistors (HEMTs) are one of the most important semiconductor devices for microwave applications because HEMTs have high output power characteristics. Two of the most important factors that determine the output power of a HEMT are the drain current density and the gate-to-drain breakdown voltage of the HEMT. In particular, the output power density can be increased by increasing the drain current density while maintaining the same operating voltage. The drain current density can be increased by increasing the electron density in the channel of the HEMT.

Attempts to increase the electron density in the channel include the development of the double-side planar-doped (DSPD) aluminum gallium arsenide (AlGaAs)/indium gallium arsenide (InGaAs)/AlGaAs HEMT substrate. Higher current density HEMT devices can be obtained by increasing the doping densities in the DSPD HEMT substrate. However, the increased doping densities produce excess electrons in the AlGaAs layers, which lower the breakdown voltage and degrade other electrical characteristics of the HEMT. Other attempts to increase the sheet charge density of a HEMT include highly doping the channel layer of the HEMT. However, the high channel doping reduces electron mobility, which degrades device performance.

Accordingly, a need exists for a semiconductor device that has higher output power but does not have low breakdown voltage or low electron mobility.

BRIEF DESCRIPTION OF THE DRAWING

The single FIGURE illustrates a cross-sectional view of an embodiment of a semiconductor device in accordance with the present invention.

For simplicity and clarity of illustration, elements in the drawings are not necessarily drawn to scale.

DETAILED DESCRIPTION OF THE DRAWING

The single FIGURE illustrates a cross-sectional view of a semiconductor device 10. As explained hereinafter with reference to the preferred embodiment, device 10 is a high electron mobility transistor that has high power out, high breakdown voltage, high carrier mobility, high power added efficiency, and improved linear performance.

Device 10 includes, among other features, a composite substrate 20. Substrate 20 includes a support substrate 21. In the preferred embodiment, substrate 21 is a compound semiconductor substrate such as, for example, a crystalline semi-insulating gallium arsenide substrate. In the alternative, substrate 21 can be comprised of semi-insulating indium phosphide or silicon. If substrate 21 is comprised of indium phosphide or silicon, the subsequently described layers of composite substrate 20 will be comprised of different materials known to those skilled in the art. However, when substrate 21 is comprised of indium phosphide or silicon, the doping concentrations of the layers will be similar to those described hereinafter.

Composite substrate 20 also includes buffer layers 22 and 23 over substrate 21. Layer 22 buffers or shields layer 23 and other layers overlying layer 23 from the stresses and defects produced by the crystal lattice mismatch between substrate 21 and layer 23. Layer 22 is preferably comprised of an epitaxial superlattice, which is grown on substrate 21 using techniques known in the art.

Layer 23 is a buffer layer that includes a doped region 24, which is a thin dopant layer for supplying device 10 with free carriers. In the preferred embodiment, layer 23 is grown on layer 22 and is comprised of epitaxial aluminum gallium arsenide where the aluminum:gallium ratio is approximately 24:76. As an example, layer 23 can be grown by molecular beam epitaxy to a thickness of approximately twenty-three nanometers. In the preferred embodiment, region 24 is a planar-doped or delta-doped layer comprised of silicon. Region 24 preferably has a doping density of approximately $2 \times 10^{12}$ atoms per centimeter$^2$. Region 24 is located within layer 23 so that region 24 is not at the top surface of region 24. Preferably, region 24 is approximately three nanometers away from the top surface of layer 23.

Composite substrate 20 further includes a layer 25 overlying buffer layer 23. Layer 25 serves as the channel for device 10. Layer 25 preferably has a high indium mole fraction to increase the electron mobility, the bandgap discontinuity, and the electron current density over that of a channel layer having a low indium mole fraction. However, as the indium mole fraction in layer 25 increases, the breakdown voltage of device 10 becomes limited by channel breakdown, which is very low in prior art devices having only channel doping.

In the preferred embodiment that optimizes these considerations, layer 25 is grown on buffer layer 23 to a thickness of approximately seventeen nanometers and is comprised of epitaxial indium gallium arsenide wherein the indium:gallium ratio is approximately 15:85. Layer 25 is doped to provide additional free carriers for device 10. Preferably, layer 25 is doped with the same dopant as used in region 24. Layer 25 preferably has a uniform doping concentration of approximately $5 \times 10^{17}$ atoms per centimeter$^3$ or a delta or planar doping density of approximately $1 \times 10^{12}$ atoms per centimeter$^2$. Therefore, the doping density of layer 25 is preferably lower than the doping density of region 24.

Composite substrate 20 also includes a barrier layer 26 overlying layer 25. Layer 26 includes a doped region 27, which is a thin dopant layer for supplying device 10 with additional free carriers. In the preferred embodiment, layer 26 is grown on layer 25 and is similar in composition to layer 23. However, layer 26 is preferably thicker than layer 23. In one embodiment, layer 26 has a thickness of approximately thirty-two nanometers.

Region 27 is preferably similar in composition to region 24. However, region 27 preferably has a higher doping density than either layer 25 or region 24. In one embodiment, the doping density of region 27 is equal to or greater than the sum of the doping densities of layer 25 and region 24. In the preferred embodiment, region 27 has a doping density of approximately $3 \times 10^{12}$ atoms per centimeter$^2$, which makes the ratio between the doping densities of regions 24 and 27 and layer 25 to be 2:3:1, respectively.

Regions 24 and 27 are preferably evenly or equally spaced apart from layer 25. If regions 24 and 27 are too close to layer 25, then the mobility of the free carriers in layer 25 is decreased. If regions 24 and 27 are too far away from layer 25, then the free carrier concentration at layer 25 will be reduced.

Composite substrate 20 additionally includes a heavily doped contact layer 28 overlying barrier layer 26. Layer 28 is more heavily doped than any of the underlying layers and regions. In the preferred embodiment, layer 28 is grown on barrier layer 26 and is comprised of epitaxial gallium arsenide doped with silicon.

A hole 29 can be formed in layer 28 to expose a portion of underlying layer 26. As illustrated in the single FIGURE, hole 29 separates two remaining portions of layer 28. Hole 29 can be created by, for example, etching layer 28 with wet or dry etchants known in the art.

After forming hole 29, a gate electrode 33 can be formed on the exposed portion of layer 26. As an example, gate electrode 33 can be comprised of titanium tungsten nitride to form a Schottky contact with layer 26. Then, a source electrode 31 and a drain electrode 32 can be formed on the remaining portions of layer 28. Alternatively, electrodes 31 and 32 can be formed before electrode 33 and even before the etching of hole 29. As an example, source electrode 31 and drain electrode 32 can be comprised of nickel germanium tungsten to form ohmic contacts with layer 28. In one embodiment, electrodes 31, 32, and 33 can be formed by sputtering or evaporating the appropriate metals onto composite substrate 20.

The total doping concentration and the relative positions of regions 24 and 27 and layer 25 are optimized to increase the drain current density while maintaining the same breakdown voltage. Higher doping concentrations reduce the doping efficiency and lower the breakdown voltage. Lower doping concentrations improve the doping efficiency and raise the breakdown voltage, but decrease the drain current density. However, by using the triple doping profile disclosed herein, the carrier mobility in layer 25, the drain current density, the free carrier mobility, and the breakdown voltage of device 10 can be improved over the prior art. Device 10 preferably does not use a double channel because gate modulation problems make it difficult to control the bottom channel.

Therefore, an improved semiconductor device is provided to overcome the disadvantages of the prior art. Due to the more efficient triple doping profile of the semiconductor device, the current density and the breakdown voltage of the device are improved. This improvement was demonstrated by a twenty-five percent higher output power and a nine percent higher power added efficiency compared to the prior art. This improvement was also demonstrated by an improved linear power performance compared to the prior art.

While the invention has been particularly shown and described mainly with reference to preferred embodiments, it will be understood by those skilled in the art that changes in form and detail may be made without departing from the spirit and scope of the invention. For instance, the numerous details set forth herein such as, for example, the exact aluminum:gallium ratio, the exact indium:gallium ratio, and the exact doping concentrations are provided to facilitate the understanding of the present invention and are not provided to limit the scope of the invention. Furthermore, layer 25 can be delta-doped, instead of uniformly doped. In this alternative embodiment, the position of the delta-doped region in layer 25 is preferably below the middle of layer 25. Moreover, although the preferred doping density ratio was described to be 2:3:1, computer simulations show that a doping density ratio of 1.5:3.5:1 will result in similar, if not better, electrical performance in the semiconductor devices. Additionally, it is understood that different epitaxial growth processes will require different ratios. However, regardless of the specific epitaxial growth process used, the doping region closest to gate electrode 33 should have the highest doping concentration.

Accordingly, the disclosure of the present invention is not intended to be limiting. Instead, the disclosure of the present invention is intended to be illustrative of the scope of the invention, which is set forth in the following claims.

What is claimed is:

1. A semiconductor device comprising:
    a buffer layer having a first doped region with a first doping density;
    a barrier layer over the buffer layer and having a second doped region with a second doping density; and
    a channel layer between the buffer layer and the barrier layer and having a third doping density,
    wherein the second doping density is higher than the first and third doping densities, and the first doping density is higher than the third doping density.

2. The semiconductor device of claim 1 wherein the first and second doped regions are delta-doped regions.

3. The semiconductor device of claim 2 wherein the channel layer is uniformly doped.

4. The semiconductor device of claim 2 wherein the channel layer is delta-doped.

5. The semiconductor device of claim 2 wherein the delta-doped regions are equally spaced apart from the channel layer.

6. A semiconductor device comprising:
    a first epitaxial layer having a first delta-doped region;
    a second epitaxial layer having a second delta-doped region, the second epitaxial layer located above the first epitaxial layer and consisting essentially of similar materials as the first epitaxial layer; and
    a third epitaxial layer located between the first and second epitaxial layers and being uniformly doped,
    wherein the second delta-doped region has a greater doping density than the first delta-doped region and the third epitaxial layer.

7. The semiconductor device of claim 6 wherein the first delta-doped region has a greater doping density than the third epitaxial layer.

8. The semiconductor device of claim 7 wherein the doping densities of the first, second, and third epitaxial layers have a ratio of approximately 2:3:1, respectively.

9. The semiconductor device of claim 6 wherein the first and second delta-doped regions are evenly spaced apart from the third epitaxial layer.

10. The semiconductor device of claim 9 wherein the first delta-doped region is approximately 3 nanometers away from the third epitaxial layer.

11. The semiconductor device of claim 10 wherein the third epitaxial layer has a thickness of approximately seventeen nanometers.

12. The semiconductor device of claim 6 wherein the semiconductor device is a high electron mobility transistor.

13. A semiconductor device comprising:
    a crystalline semi-insulating gallium arsenide substrate;
    a superlattice buffer layer on the semi-insulating gallium arsenide substrate;
    a first aluminum gallium arsenide epitaxial layer on the superlattice buffer layer;
    a first silicon delta-doped layer in the first aluminum gallium arsenide epitaxial layer;
    an indium gallium arsenide epitaxial layer uniformly doped with silicon on the first aluminum gallium arsenide epitaxial layer;
    a second aluminum gallium arsenide epitaxial layer on the indium gallium arsenide epitaxial layer;

a second silicon delta-doped layer in the second aluminum gallium arsenide epitaxial layer; and a gallium arsenide epitaxial layer over the second aluminum gallium arsenide epitaxial layer, the gallium arsenide epitaxial layer having a silicon doping density greater than silicon doping densities of the first and second silicon delta-doped layers and the indium gallium arsenide epitaxial layer.

14. The semiconductor device of claim 13 wherein the doping density of the second silicon delta-doped layer is greater than the doping density of the first silicon delta-doped layer and the doping density of the indium gallium arsenide epitaxial layer.

15. The semiconductor device of claim 14 wherein the doping density of the first silicon delta-doped layer is greater than the doping density of the indium gallium arsenide epitaxial layer.

16. The semiconductor device of claim 13 wherein the doping density of the second silicon delta-doped layer is greater than or equal to a sum of the doping density of the first silicon delta-doped layer and the doping density of the indium gallium arsenide epitaxial layer.

17. The semiconductor device of claim 16 wherein the doping density of the second silicon delta-doped layer is approximately $3 \times 10^{12}$ atoms per centimeter$^2$, wherein the doping density of the first silicon delta-doped layer is approximately $2 \times 10^{12}$ atoms per centimeter$^2$, and wherein the doping density of the indium gallium arsenide epitaxial layer is approximately $1 \times 10^{12}$ atoms per centimeter$^2$.

18. The semiconductor device of claim 16 further comprising:

a nickel germanium tungsten drain electrode on a first portion of the gallium arsenide epitaxial layer;

a nickel germanium tungsten source electrode on a second portion of the gallium arsenide epitaxial layer wherein a hole in the gallium arsenide epitaxial layer separates the first and second portions of the gallium arsenide epitaxial layer from each other; and a titanium tungsten nitride gate electrode in the hole of the gallium arsenide layer and on the second aluminum gallium arsenide epitaxial layer, wherein the indium gallium arsenide epitaxial layer is a channel layer for a transistor.

19. The semiconductor device of claim 16 wherein a portion of the first aluminum gallium arsenide epitaxial layer is located between the first silicon delta-doped layer and the indium gallium arsenide epitaxial layer, the portion of the first aluminum gallium arsenide epitaxial layer having a thickness of approximately three nanometers, the first aluminum gallium arsenide epitaxial layer having an aluminum:gallium ratio of approximately 24:76, wherein a portion of the second aluminum gallium arsenide epitaxial layer is located between the second silicon delta-doped layer and the indium gallium arsenide epitaxial layer, the portion of the second aluminum gallium arsenide epitaxial layer having a thickness of approximately three nanometers, the second aluminum gallium arsenide epitaxial layer having an aluminum:gallium ratio of approximately 24:76, and wherein the indium gallium arsenide epitaxial layer has a thickness of approximately seventeen nanometers and has an indium:gallium ratio of approximately 15:85.

* * * * *